(12) United States Patent
Maximo (10) Patent No.: US 9,337,863 B1
(45) Date of Patent: May 10, 2016

(54) METHODS AND APPARATUS FOR RATIONAL COMPRESSION AND DECOMPRESSION OF NUMBERS

(71) Applicant: EMC Corporation, Hopkinton, MA (US)

(72) Inventor: André de Almeida Maximo, Rio de Janeiro (BR)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 14/923,775

(22) Filed: Oct. 27, 2015

Related U.S. Application Data

(63) Continuation of application No. 14/749,833, filed on Jun. 25, 2015, now Pat. No. 9,209,833.

(51) Int. Cl.
*H03M 7/40* (2006.01)
(52) U.S. Cl.
CPC .................. *H03M 7/405* (2013.01)
(58) Field of Classification Search
CPC ............................. H03M 7/40; H03M 7/405
USPC ....................................................... 341/65, 67
See application file for complete search history.

(56) References Cited

U.S. PATENT DOCUMENTS

| | | | | |
|---|---|---|---|---|
| 7,043,088 B2 * | 5/2006 | Chiu | ...................... | H04N 19/91 375/E7.144 |
| 7,586,424 B2 * | 9/2009 | Monro | ..................... | H03M 7/24 341/107 |
| 7,609,179 B2 * | 10/2009 | Diaz-Gutierrez | ....... | H03M 7/40 341/50 |
| 7,845,571 B2 * | 12/2010 | Monro | ..................... | H03M 7/40 235/494 |
| 8,959,129 B2 * | 2/2015 | Wegener | ................. | G06F 7/483 708/203 |

* cited by examiner

*Primary Examiner* — Khai M Nguyen
(74) *Attorney, Agent, or Firm* — Ryan, Mason & Lewis, LLP

(57) ABSTRACT

Methods and apparatus are provided for rational compression of numbers. One or more numbers are compressed by obtaining a plurality of numbers (e.g., integer numbers and/or floating point numbers), wherein each of the plurality of numbers is represented using zero or more bits to indicate an exponent at a given base of the given number and has a length representing a number of significant bits of the given number; for each of the plurality of numbers, obtaining a pair of values comprised of the length and the exponent and counting occurrences of the pair; generating a Huffman encoding comprising at least one Huffman tree based on the counting of the occurrences; generating one or more encoding maps comprising an array mapping each of the pair to a corresponding Huffman prefix code; and encoding at least one of the plurality of numbers using the one or more encoding maps.

25 Claims, 3 Drawing Sheets

FIG. 6

METHODS AND APPARATUS FOR RATIONAL COMPRESSION AND DECOMPRESSION OF NUMBERS

CROSS-REFERENCE TO RELATED APPLICATIONS

This application is a continuation of U.S. patent application Ser. No. 14/749,833, filed Jun. 25, 2015, incorporated by reference herein.

FIELD The field relates generally to lossless data compression of data, such as seismic data.

BACKGROUND

Data compression techniques are commonly used to achieve a reduced bit rate in the digital representation of signals for efficient processing, transmission, and storage. The content of a file is said to be passive of compression when the total storage size of the file can be reduced. There is a limit for this reduction, however, depending on the content, imposing a limit on compression. A compression algorithm generally searches for a different representation of the content, in order to decrease the space required to store the content. The result is a compressed file that has the potential to be restored to the exact original uncompressed file for the case of lossless compression, or to an approximation or similar version of the original uncompressed file for the case of lossy compression. The algorithm to restore the original file is referred to as a decompression algorithm and usually consists of the reverse steps of the compression algorithm.

The size of seismic datasets, for example, continues to increase due to the need to extract oil from more complex geologies. Thus, seismic data compression has become important in geophysical applications, for efficient processing, storage and transmission of seismic data. A need therefore exists for improved techniques for compressing both raw and processed data, such as seismic data. A further need exists for a lossless compression algorithm that uses prior knowledge about the data (e.g., a compression algorithm specific for numbers).

SUMMARY

Illustrative embodiments of the present invention provide methods and apparatus for rational compression of numbers, such as seismic data. In one exemplary embodiment, one or more numbers are compressed by obtaining a plurality of numbers (e.g., integer numbers and/or floating point numbers), wherein each of the plurality of numbers is represented using zero or more bits to indicate an exponent at a given base of the given number and has a length representing a number of significant bits of the given number; for each of the plurality of numbers, obtaining a pair of values comprised of the length and the exponent and counting occurrences of the pair of values; generating a Huffman encoding comprising at least one Huffman tree based on the counting of the occurrences of the pair of values; generating one or more encoding maps comprising an array mapping each of the pair of values to a corresponding Huffman prefix code; and encoding at least one of the plurality of numbers using the one or more encoding maps. In the case of integer numbers, the exponent comprises zero bits and for floating point numbers, a significand has the length.

In at least one exemplary embodiment, the counting of the occurrences of the pair of values comprises incrementing a histogram bin associated with the pair. The Huffman encoding optionally comprises one Huffman tree for a histogram of the pair where each leaf has a subjacent Huffman tree for a histogram of the length.

In at least one exemplary embodiment, the encoding maps are generated by traversing paths within a plurality of the Huffman trees, where each path is one prefix code and leads to one leaf node storing one or more of the pair and the length.

According to one aspect of the invention, for compressing floating point numbers, the step of encoding the at least one of the plurality of floating point numbers further comprises computing the pair for each of the at least one of the plurality of floating point numbers and retrieving the corresponding Huffman prefix code for the pair and the corresponding Huffman prefix code for the length from the one or more encoding maps.

According to one aspect of the invention, a multi-core computer and/or a multi-node server are employed and a plurality of instances of the system operate in parallel to compress a corresponding portion of a divided input independently.

Advantageously, illustrative embodiments of the invention provide improved lossless compression and decompression of seismic data and other data. These and other features and advantages of the present invention will become more readily apparent from the accompanying drawings and the following detailed description.

DETAILED DESCRIPTION

Illustrative embodiments of the present invention will be described herein with reference to exemplary communication, storage and processing devices. It is to be appreciated, however, that the invention is not restricted to use with the particular illustrative configurations shown. Aspects of the invention provide methods and apparatus for rational compression and decompression of numbers, such as integers and floating point data.

According to one aspect of the invention, algorithms are provided for compression and decompression of integer and floating point numbers based on a rational representation of the numbers. In at least one embodiment, the algorithm provides an indexing structure for encoding and decoding using characteristics of the number itself, avoiding the need for additional data structures, and thus improving compression efficiency. More specifically, the exemplary algorithm converts numbers into their rational representation to extract compressible patterns from this representation. The rational representation unveils an encoding and decoding procedure that can be exploited for compression.

The disclosed algorithms are particularly suitable for data originating from seismic acquisitions or scientific experiments, since at least one embodiment of the algorithm is specialized for a collection of numbers. While the exemplary embodiments are described herein using seismic data, aspects of the present invention can be applied to other forms of data, as would be apparent to a person of ordinary skill in the art based on the present disclosure.

According to another aspect of the invention, distributed compression and decompression is achieved using a plurality of instances of the disclosed algorithms operating on a multi-core computer and/or a multi-node server in parallel. The exemplary algorithm acts on a collection of numbers, that is, a sequence of numbers without order, making it scalable for multiple executions in parallel.

Seismic Data

Oil and gas companies typically acquire and process seismic data from a given prospect area before drilling a well in the area. Seismic acquisition comprises generating acoustic waves using a source, such as a vibrator unit, dynamite shot, or an air gun, and then collecting data related to the reflected waves. The signals are collected by means of receivers referred to as geophones (when the acquisition occurs onshore) or hydrophones (when the acquisition occurs offshore). The receivers convert acoustic vibrations into streams of digital samples having in general a number of bits from 8 to 32 bits. Samples are continuously collected at intervals that have a constant duration (typically between 2 and 8 milliseconds) and data is typically collected by many receivers simultaneously. Seismic datasets can have many terabytes of raw data and their processing generates other additional datasets at various points throughout the seismic processing steps.

In spite of the fact that lossy compression algorithms are able to reach much higher compression ratio, lossless compression is desirable in the various steps of seismic processing. The original data has to be preserved with the original precision in order to avoid losing relevant information. In particular, complicated geologies, such as in pre-salt areas, have a very low signal-to-noise ratio, which makes the preservation of high data frequencies even more important (in lossy compression methods, high frequencies are often attenuated, so that higher compression ratios can be obtained). Therefore, it is often important to ensure that the employed compression methods are lossless.

Seismic processing workflows typically correspond to various steps that modify the raw data, creating new seismic data files at each step. Depending on the phase and processing techniques utilized, the size of the resulting file can be as large as the original file. Discovering ways to reduce the size occupied by these large data files and store them efficiently is a problem that needs to be addressed.

Thus, storage and transfer of seismic data demands lossless compression. The creation of algorithms that achieve high compression ratio are important to save storage and transmission time.

As seismic data files can be very large, the time to compress them can be very long, sometimes taking many days to obtain a good compression ratio. In this way, reducing the time to obtain good compression ratios by orders of magnitude can be very relevant to the industry.

Oil and gas companies are often global companies and the interpretation of seismic data is a process in which Geophysicists and Geologists often have to collaborate over distance. The efficient transmission of these data is essential to make this process productive. A good compression ratio is important to save time during the transmission, in particular when it is necessary to send data with limited bandwidth and without any information loss.

On a computer system, data is usually a sequence of bits (binary digits) where each bit is a number in base-2, (i.e., either a binary 0 or a binary 1). The sequence of bits may represent, for example, a number, a text, an image, a sound, or any kind of information. The information persists on a computer system through the use of data storage devices, such as magnetic tapes, hard-disks and solid-state drives.

In the oil and gas industry, seismic data is often stored as seismic traces using one of several standards developed by the Society of Exploration Geophysicists (SEG) for storing seismic data. The most commonly used format is SEG Y. Within the most common type of SEG Y files, a seismic trace is represented by a sequence of 32-bit floating point numbers. To work with this type of data without losing any information, special care is necessary.

Thus, seismic sample data are often represented as floating point numbers. Typical formats are the IBM® and IEEE 754 single precision, floating point representations, which specify how a real number is stored in 32 bits. These representations reserve one bit to indicate the sign of the number, with the other 31 bits being split into an exponent at a certain base and a significand, such that a real number R is calculated as:

$$R = (-1)^{sign} \times \text{significand} \times b^{exponent}.$$

The main difference between the IBM® floating point format and the IEEE 754 format is the number of bits reserved to each part and the base b of the exponent. The exemplary algorithms presented here have been designed for the IEEE 754 format, since it is often employed in modern day computing, but they can be generalized to other formats, as would be apparent to a person of ordinary skill in the art.

Figure 1:
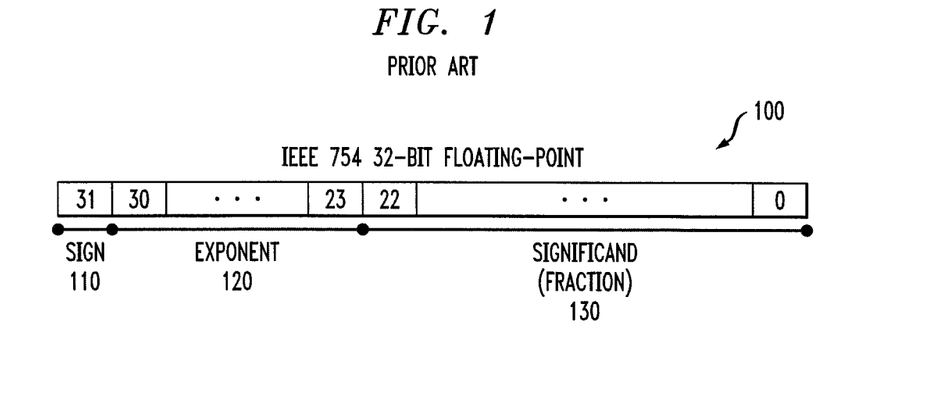
FIG. 1 illustrates an exemplary single precision floating point number in accordance with an exemplary IEEE 754 floating point standard.

FIG. 1 illustrates an exemplary single precision floating point number 100 in accordance with the IEEE 754 floating point standard. As shown in FIG. 1, the exemplary single precision floating point number 100 uses one bit for the sign 110, eight bits for the exponent 120 in base 2, and 23 bits for the normalized significand 130, meaning that a real number R is calculated as:

$$R = (-1)^{sign} \times \text{significand} \times 2^{exponent}.$$

While an integer type represents whole numbers, the floating point type represents numbers with a fractional part. Seismic data acquisition and scientific data exploration typically have these two types of numbers as their core binary data. Additionally, data prominent from surveys, simulations and experiments consume a massive amount of storage space.

In the area of seismic data acquisition or scientific simulation, the option of lossless compression may be more attractive, or even a requirement, due to the cost of producing the data. One strategy is to disregard the meaning of the sequence of bits, that is, if they are or they are not numbers, and realize a generic lossless compression algorithm. There are two main disadvantages in this strategy. First, the timing performance to compress and decompress a given file may be affected, since a generic algorithm must spend time searching for compressible patterns without any prior knowledge about the data. Second, the reduction efficiency, or compression ratio, may also be affected due to failing in finding the best compressible pattern in the file. These disadvantages impose a challenge to the use of generic lossless compression algorithms for seismic or scientific data.

In order to overcome the waste of storage space within a collection of numbers with a fixed length of bits, and without losing information about each number, aspects of the present invention define an algorithm to encode and decode each number with a reduced length. The result is a compressed collection composed of numbers with variable lengths, which is capable of being decompressed to the original length.

The following discussion is divided into three parts: an explanation of the representation of numbers on a computer system; a description of rational numbers and their representation and interaction with other numbers; and a discussion of the basic data structures and algorithms used herein.

Representation of Numbers Integers are usually represented by a sequence of 32 bits, where the first bit is the sign bit, in the case of signed integers, indicating if it is a positive or negative integer number, and the remaining bits are the integer number itself in base-2. Unsigned integers do not have the sign bit, using the first bit as one more bit for the number itself. Any leading zeros appearing on the left of the sequence, except the sign bit, are not significant bits since they can be omitted for the same numeric value. The floating point type 100 allows expressing the fractional part of a number by inserting into the sequence, with usually the same 32 bits length, the exponent 120. The second bit to the ninth usually represents this exponent 120 as an integer between a minimum and a maximum exponent in base-2. The exponent 120 may be biased in the sense that the exponent 120 is subtracted by a fixed number to represent negative and positive exponents. A bias of 127 means the exponent varies from −127 to 128. The tenth bit to the end of the sequence usually represents the fraction, also called mantissa or significand 130, part of the floating point number 100. The fraction 130 may be in normalized form, in which case the most significant bit is hidden in the sequence since it is always a binary 1. Any trailing zeros appearing on the right of the fraction sequence are not significant bits since they can be omitted for the same numeric value.

Integer and floating point numbers may be represented by a different specification and may have different lengths of bits. There are several international standards that guide the definition of numbers on a computer system, and the computer system may even use a base other than binary (base-2). While the explanation given for integer and floating point numbers serves as a baseline for the concepts used herein, the disclosed rational compression algorithm works independently from the specification, length and base of the number, as would be apparent to a person of ordinary skill in the art.

Rational Numbers and Their Representation

The exemplary rational compression algorithm works by changing the representation of the original number by its rational representation to compress the number more efficiently. A rational number is characterized by a ratio, involving an integer numerator p and an integer denominator q, as follows:

$$p/q,$$

where $q \neq 0$. When $q=1$, the rational number is an integer number. A floating point number f is defined by the significand s 130 excluding the trailing zeros, the base b and the exponent e, as follows:

$$f = s \cdot b^e,$$

where, in a binary computer system, $b=2$ and both the significand 130 and exponent 120 are sequences of bits. If s is an integer number, the rational representation of f is expressed as follows:

$$\frac{s}{2^{-e}}.$$

where the denominator $2^{-e}$ rises, in the case of a negative power of two, to multiply the numerator. This rational representation of f implies the fraction to be zero, which is the significand s 130, is only an integer number when its length l (of the significand sequence of bits) is zero and, consequently, the numerator becomes the hidden normalization bit: 1. By definition, for a normalized floating point number, the significand s 130 that is the fractional part of the number, is a sequence of bits on the right of the binary dot without the trailing zeros.

The rational representation of floating point numbers with zero fractional part excludes the majority of numbers, rendering it useless. The exemplary rational compression algorithm defines both numerator and denominator for a floating point number that are susceptible for compression. The numerator is defined by the result of multiplying the significand s 130 by 2 to the power of the length of the significand sequence l, as follows:

$$p = s * 2^l.$$

In other words, rewriting s as an integer number and shifting the fraction l bits to the right is equivalent to multiplying it by $2^l$. In addition to the fractional part, the sign bit 110 is concatenated to the beginning of the significand sequence to make s a signed integer number. The denominator is defined by $2^{-e}$ multiplied by $2^l$ to compensate for the multiplication inserted on the numerator, that is:

$$q = 2^{l-e}.$$

These definitions of q and p are used to guide the encoding and decoding of floating point numbers within the steps of the exemplary rational compression algorithm. The final floating point number in its rational representation is expressed as follows:

$$f = \frac{s \cdot 2^l}{2^{l-e}}.$$

Note two properties of this representation useful to encode and decode numbers. First, the powers are always of two (or of the base of the number) and, therefore, the number two (or the base) can be ignored. Second, the variable l carries the information of how many bits must be read to obtain s. This information is useful to restore a sequence of s values with variable lengths. These properties lead the exemplary embodiment of the rational compression algorithm to concentrate on the (l−e) and l values presented in any floating point number.

Data Structures and Algorithms

Figure 2:
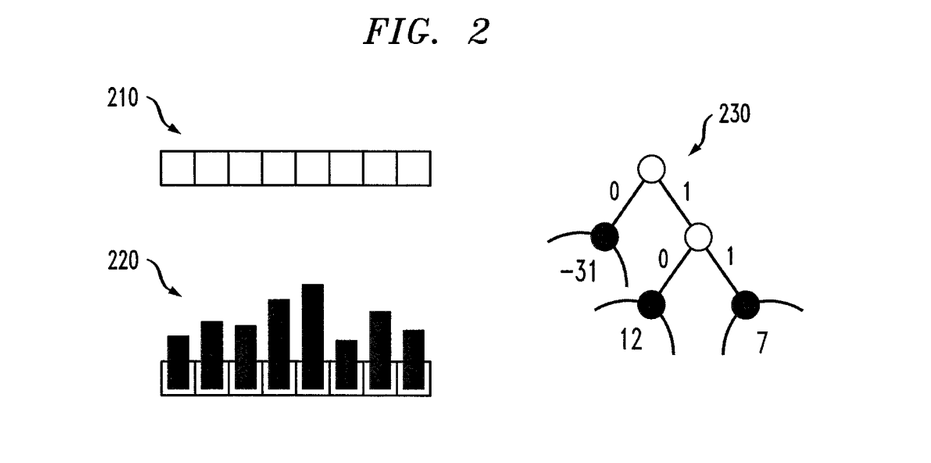
FIG. 2 illustrates a number of exemplary data structures and algorithms used by the exemplary embodiment of the rational compression algorithm.

FIG. 2 illustrates a number of exemplary data structures and algorithms used by the exemplary embodiment of the rational compression algorithm. As shown in FIG. 2, the exemplary embodiment of the rational compression algorithm employs one or more arrays 210 and histograms 220. An array 210 is a data structure that stores values with a corresponding position inside the array. A histogram 220 is an array where the values are frequencies, useful to count the occurrences of each element in a collection. In the exemplary embodiment of FIG. 2, the array 210 has 8 positions and is used to store the occurrences of 8 elements in a collection by the histogram 220, where the size of the bars inside the array represents the number of occurrences.

FIG. 2 also illustrates a binary tree 230, which is a Huffman tree with two internal nodes (white open circles) and three leaf nodes (black closed circles). A binary tree 230 is a data structure for mapping, useful to map a key to a value. A Huffman tree is a binary tree whose keys are the minimum prefix code of each value or element in a collection. A code is a sequence of bits representing a certain value, generally with fewer bits than the value itself. The prefix code is a particular type of code whose prefix, i.e., initial sequence, does not repeat in any other code. The Huffman coding algorithm receives as input a histogram 220 of the frequencies of elements to be encoded, and returns as output the Huffman tree corresponding to the distribution presented in the histogram 220. The Huffman coding and tree are generally used for lossless compression.

The exemplary binary tree 230 encodes the number—with the code 0, the number 12 with the code 10 and the number 7 with the code 11. The code sequences are represented by the path from node to node in the tree, in a known manner. For a more detailed discussion of the exemplary data structures and algorithms shown in FIG. 2, see, for example, T. H. Cormen et al., "Introduction to Algorithms," published by The MIT Press, ISBN 978-0262033848, incorporated by reference herein.

Rational Compression Algorithm

In at least one embodiment, the exemplary rational compression algorithm comprises a compression mode and a decompression mode.

Figure 3:
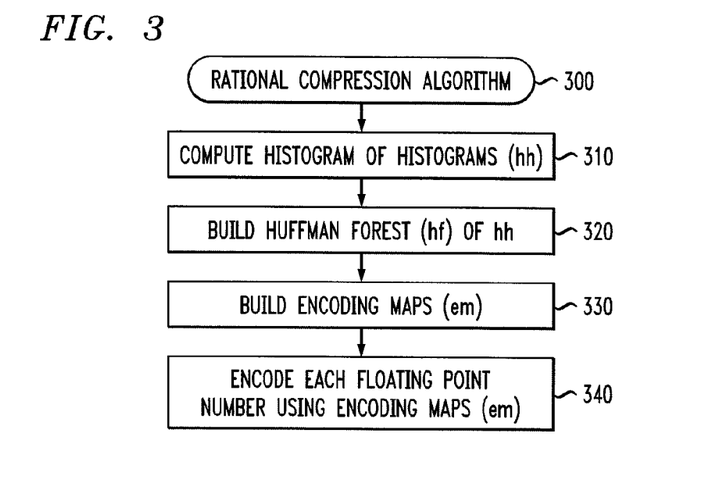
FIG. 3 is a flow chart illustrating an exemplary implementation of the rational compression algorithm, according to one embodiment of the invention.

FIG. 3 is a flow chart illustrating an exemplary implementation of the rational compression algorithm 300 according to one embodiment of the invention. The exemplary rational compression algorithm 300 receives as input a file storing a collection of floating point numbers and returns as output a compressed file storing the same collection in a compressed form.

As shown in FIG. 3, the exemplary read threshold voltage adjustment process 300 initially computes a histogram of histograms (hh) during step 310, which is one histogram of (l–e) occurrences where each element is another histogram of l occurrences. An exemplary histogram of histograms (hh) 400 is discussed further below in conjunction with FIG. 4A.

During step 320, the exemplary read threshold voltage adjustment process 300 builds a Huffman forest (hf) of hh, that is one Huffman tree for the histogram of (l–e) where each leaf has a subjacent Huffman tree for the histogram of l. An exemplary Huffman forest (hf) 450 of hh is discussed further below in conjunction with FIG. 4B.

During step 330, the exemplary read threshold voltage adjustment process 300 builds encoding maps (em), that is one array mapping each (l–e) and l into its corresponding Huffman prefix codes. The encoding maps (em) are an array of prefix codes for each (l–e) value with another subjacent array of prefix codes for each l value. These arrays are built by traversing all possible paths within all Huffman trees in hf (generated during step 320 and as discussed further below in conjunction with FIG. 4B), where each path is one prefix code and leads to one leaf node storing (l–e), in the case of the main Huffman tree (460), or l, in the case of the subjacent Huffman tree (470). The encoding maps (em) contain the code sequence for all possible (l–e) and l values appearing in the input collection of floating point numbers.

During step 340, the exemplary read threshold voltage adjustment process 300 encodes each floating point number using the encoding maps (em), as discussed further below in conjunction with a section entitled "Encoding Floating Point Numbers Into Compressed Bits."

Figure 4A:
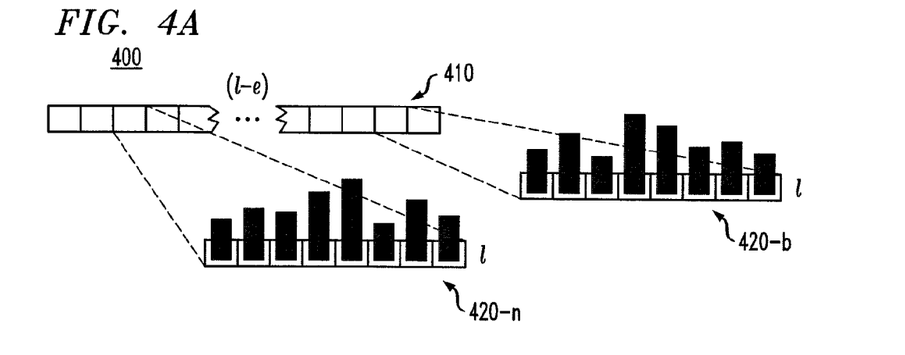
FIG. 4A illustrates an exemplary histogram of histograms generated by the exemplary rational compression algorithm of FIG. 3.

FIG. 4A illustrates an exemplary histogram of histograms (hh) 400 generated by the exemplary rational compression algorithm 300 during step 310. As shown in FIG. 4A, the exemplary histogram of histograms (hh) 400 is one histogram 410 of (l–e) occurrences where each element is another histogram 420-i of l occurrences. The main histogram 410 counts the occurrences of (l–e) with another histogram 420 counting the occurrences of l. More specifically, for each unique floating point number f in the input collection, compute l and (l–e) from f and increment hh[l–e][l], that is the occurrence of l in its corresponding histogram 420 inside the histogram 410 of (l–e). This increment affects only one histogram 420, counting the occurrences of l, given the occurrence of (l–e). On the flip side, the occurrence of (l–e) is counted by the summation of all occurrences of l in its internal histogram. The range of the main histogram 410 is the possible range of (l–e) values plus two special positions. One for invalid numbers, such as infinity and NaN (not-a-number), which have a special sequence of bits that must be preserved, and another for the number zero whose fraction is not normalized and has length zero, that is l=0. The range of each internal histogram 420, contained inside each position of the main histogram 410, is the possible range of l. For 32 bit floating point numbers, with 1 sign bit, 8 bits for the exponent and 23 bits for the fractional part, the range of the main histogram 410 is 281 and the range of each internal histogram 420 is 23.

Figure 4B:
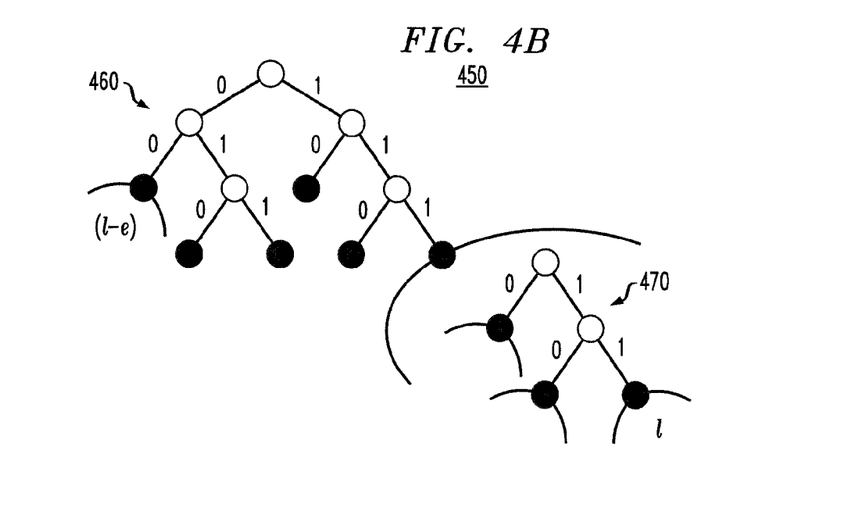
FIG. 4B illustrates an exemplary Huffman forest generated by the exemplary rational compression algorithm of FIG. 3.

FIG. 4B illustrates an exemplary Huffman forest (hf) 450 of hh generated by the exemplary rational compression algorithm 300 during step 320. As shown in FIG. 4B, one Huffman tree 460 is built for the main histogram 410 of (l–e) occurrences, and one subjacent Huffman tree 470-i for each internal histogram of l occurrences. These Huffman trees 460, 470 form the Huffman forest hf 450 that is useful for both compression and decompression. The Huffman forest 450 is stored in the beginning of the compressed output file. A Huffman forest (hf) 450 is also referred to herein as a Huffman encoding.

Encoding Floating Point Numbers Into Compressed Bits

As indicated above, during step 340, the exemplary rational compression algorithm 300 encodes each floating point number f into a compressed sequence of bits using the encoding maps generated during step 330. More specifically, for each f in the input, compute l and (l–e) from f and retrieve the prefix code for (l–e) and the prefix code for l from (em). The resulting sequence of bits for f is composed of: first, the (l–e) prefix code; second, the l prefix code; and third, the significand sequence s extracted from f. The normalization bit is not present and the last bit of the sequence s is excluded from the resulting sequence since it is always 1. By definition, the sequence s is composed of all significand bits on the right of the binary dot without the trailing zeros. This resulting sequence is considered compressed when its length is smaller than the original sequence of bits used to represent the floating point number f. The input collection is completely encoded and stored after the Huffman forest hf in the compressed output file.

Decompression

Figure 5:
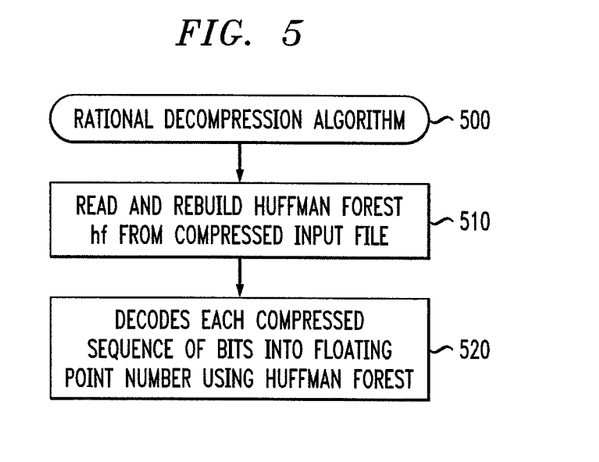
FIG. 5 is a flow chart illustrating an exemplary implementation of the rational decompression algorithm, according to one embodiment of the invention.

FIG. 5 is a flow chart illustrating an exemplary implementation of the rational decompression algorithm 500 according to one embodiment of the invention. Generally, the exemplary rational decompression algorithm receives as input a compressed file storing the Huffman forest 450 and the collection of floating point numbers in compressed form and returning as output an uncompressed file exactly the same as the original file before compression.

As shown in FIG. 5, the exemplary rational decompression algorithm 500 initially reads and rebuilds the Huffman forest hf 450 from the compressed input file during step 510. The Huffman forest 450 contains the necessary information to decode all possible prefix codes for (l−e) and l values appearing in the compressed collection. The first Huffman tree 460 in hf is the main tree of the histogram of (l−e) occurrences, and all other Huffman trees 470 in hf are the subjacent trees of the histogram of l occurrences. The order of each subjacent Huffman tree 470 matches the order of the main histogram 410 of (l−e), that is the same order of the internal histograms of l. During step 510, only the Huffman forest hf 450 is rebuilt, the encoding maps or the histograms 400 are not required for decompression.

Thereafter, the exemplary rational decompression algorithm 500 decodes each compressed sequence of bits into a floating point number using the Huffman forest hf 450 during step 520. More specifically, the compressed input file is read after the Huffman forest 450 as a sequence of bits, and, for each bit, the main Huffman tree is traversed until a leaf node is reached. The leaf node contains the (l−e) value corresponding to the current floating point number f. This process is repeated for the corresponding subjacent Huffman tree, traversing it until a leaf node is reached. This second leaf node contains the l value of the current number f that allows to read the next l bits to construct the significand sequence s of the floating point number f. With s, l and (l−e), the floating point number f is restored using its rational representation: $f=s*2^l/2^{l-e}$. The input compressed collection is completely decoded and written in an uncompressed output file.

Variations

In one variation, the algorithm is tailored for integer numbers, where the rational representation has the numerator equal to the integer number itself and the denominator is equal to 1. The input collection of integer numbers is compressed using only the length in bits of each integer. This length may be used similarly to the length l of a floating point number, to enable the integer to be restored without the leading zeros and excluding the first bit 1. The length of the integer, however, does not contribute to restore the original integer since it does not have a fractional part. The Huffman forest 450 reduces to only one Huffman tree 460 encoding the length of the integer, and the other parts of the algorithm remain the same. In the case of integers, the length has the meaning of significant bits of the integer number while in the case of floating-point numbers, the length has the meaning of the significand.

In another variation, the rational compression algorithm 300 is adapted to work with a mixed collection of integer and floating point numbers, or with different specifications of numbers. The strategy is to increment or decrement positions in the main histogram 410 or internal histograms 420, to support these different numbers. For instance, in addition to the two special positions in the histogram 410 of (l−e) values of a floating point number, one more special position may be used for integer values, in the case of a mixed collection. The range of the internal histogram 420 of l is also incremented to support both the length of the significand of a floating point number and the length of an integer number. Another example is to consider a floating point number with a special sequence to represent the result of an arithmetic division by zero. This may also add a position to the main histogram, similarly to the infinite and NaN (not-a-number) representations. The Huffman forest 450 is built using these adapted histograms, and the other parts of the algorithm remain the same.

A third variation replaces the histograms 400 with a different combination of histograms or with only one histogram. For instance, the main histogram 410 may count the occurrences of only the exponent e extracted from each floating point number f, instead of the (l−e) value, and the internal histograms may continue to count the occurrences of l. The Huffman forest 450 is built using these histograms 400, and the encoding may continue to preserve the significand sequence s. The decoding stills works, since the number f may still be restored from s, l and e. This strategy may also be inverted, with the main histogram 410 counting the occurrences of l and the internal histograms 420 counting the occurrences of e. Another example is to replace the histogram of histograms 400 with only one histogram counting the occurrence of the pair l and e. This reduces the Huffman forest 450 to only one Huffman tree, encoding the pair l and e, and the other parts of the algorithm 300 remain the same.

In yet another variation, a further lossless compression strategy is added to the significand sequence s, instead of preserving the sequence in the compressed file. One strategy may search for repeatable subsequences in the original significand sequence of bits and may create a dictionary of these subsequences. The repeating subsequences are replaced by an indexing code to the dictionary, which contains only one instance of each subsequence. The compression is effective if the indexing codes and dictionary reduce the length of the encoded subsequence. The dictionary may be stored after the Huffman forest and the indexing codes may replace the corresponding subsequences.

A further variation replaces the Huffman forest 450 by a different encoding strategy. For instance, a dictionary may be constructed for both l and e values. It may be a static dictionary using previous knowledge of the collection of numbers to be compressed, or a dynamic dictionary adapting as the collection is compressed, or a combination of both. The encoding and decoding of numbers are similar to using the Huffman forest.

An additional variation adapts the rational compression algorithm 300 for a multi-core computer or a multi-node server. A multi-core computer system is composed of a number of processing units capable of carrying out the computation in parallel, as if each one is a separable computer system. A multi-node server is a distributed environment with a number of interconnected computer systems. One strategy to parallelize the algorithm is to divide the input collection into collections with similar sizes, one for each computer system, and execute several instances of the algorithm.

Conclusion

Aspects of the present invention are described herein with reference to flowchart illustrations and/or block diagrams of methods, apparatus (systems) and computer program products according to embodiments of the invention. It is to be appreciated that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As further described herein, such computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, as further detailed below, at least one embodiment of the invention includes an article of manufacture tangibly embodying computer readable instructions which, when implemented, cause a computer to carry out techniques described herein. An article of manufacture, a computer program product or a computer readable storage medium, as used herein, is not to be construed as being transitory signals, such as electromagnetic waves.

The computer program instructions may also be loaded onto a computer or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s). It should be noted that the functions noted in the block may occur out of the order noted in the figures.

Accordingly, the techniques described herein can include providing a system, wherein the system includes distinct software modules, each being embodied on a tangible computer-readable recordable storage medium (for example, all modules embodied on the same medium, or each modules embodied on a different medium). The modules can run, for example, on a hardware processor, and the techniques detailed herein can be carried out using the distinct software modules of the system executing on a hardware processor.

Additionally, the techniques detailed herein can also be implemented via a computer program product that includes computer useable program code stored in a computer readable storage medium in a data processing system, wherein the computer useable program code was downloaded over a network from a remote data processing system. The computer program product can also include, for example, computer useable program code that is stored in a computer readable storage medium in a server data processing system, wherein the computer useable program code is downloaded over a network to a remote data processing system for use in a computer readable storage medium with the remote system.

As will be appreciated by one skilled in the art, aspects of the present invention may take the form of an entirely hardware embodiment, an entirely software embodiment (including firmware, resident software, micro-code, etc.) or an embodiment combining software and hardware aspects that may all generally be referred to herein as a "module" or "system."

An aspect of the invention or elements thereof can be implemented in the form of an apparatus including a memory and at least one processor that is coupled to the memory and operative to perform the techniques detailed herein. Also, as described herein, aspects of the present invention may take the form of a computer program product embodied in a computer readable medium having computer readable program code embodied thereon.

Figure 6:
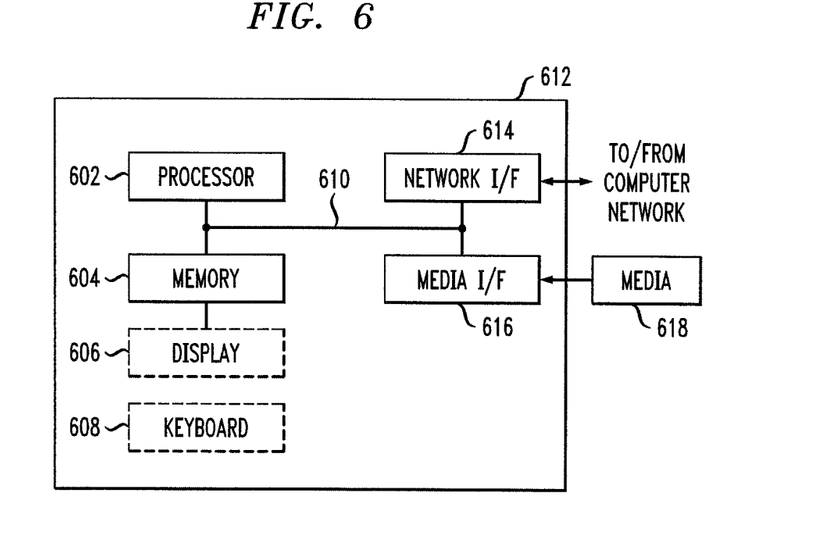
FIG. 6 is a system diagram of an exemplary computer system on which at least one embodiment of the invention can be implemented.

By way of example, an aspect of the present invention can make use of software running on a general purpose computer. FIG. 6 is a system diagram of an exemplary computer system on which at least one embodiment of the invention can be implemented. As depicted in FIG. 6, an example implementation employs, for example, a processor 602, a memory 604, and an input/output interface formed, for example, by a display 606 and a keyboard 608. The term "processor" as used herein includes any processing device(s), such as, for example, one that includes a central processing unit (CPU) and/or other forms of processing circuitry. The term "memory" includes memory associated with a processor or CPU, such as, for example, random access memory (RAM), read only memory (ROM), a fixed memory device (for example, a hard drive), a removable memory device (for example, a diskette), a flash memory, etc. Further, the phrase "input/output interface," as used herein, includes a mechanism for inputting data to the processing unit (for example, a mouse) and a mechanism for providing results associated with the processing unit (for example, a printer).

The processor 602, memory 604, and input/output interface such as display 606 and keyboard 608 can be interconnected, for example, via bus 610 as part of a data processing unit 612. Suitable interconnections via bus 610, can also be provided to a network interface 614 (such as a network card), which can be provided to interface with a computer network, and to a media interface 616 (such as a diskette or compact disc read-only memory (CD-ROM) drive), which can be provided to interface with media 618.

Accordingly, computer software including instructions or code for carrying out the techniques detailed herein can be stored in associated memory devices (for example, ROM, fixed or removable memory) and, when ready to be utilized, loaded in part or in whole (for example, into RAM) and implemented by a CPU. Such software can include firmware, resident software, microcode, etc.

As noted above, a data processing system suitable for storing and/or executing program code includes at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation. Also, input/output (I/O) devices such as keyboards 608, displays 606, and pointing devices, can be coupled to the system either directly (such as via bus 610) or through intervening I/O controllers.

Network adapters such as network interface 614 (for example, a modem, a cable modem or an Ethernet card) can also be coupled to the system to enable the data processing system to become coupled to other data processing systems or remote printers or storage devices through intervening private or public networks. p As used herein, a "server" includes a physical data processing system (such as system 612 as depicted in FIG. 6) running a server program. It will be understood that such a physical server may or may not include a display and keyboard.

As noted, at least one embodiment of the invention can take the form of a computer program product embodied in a computer readable medium having computer readable program code embodied thereon. As will be appreciated, any combination of computer readable media may be utilized. The computer readable medium can include a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Examples include an electrical connection having one or more wires, a portable computer diskette, a hard disk, RAM, ROM, an erasable programmable read-only memory (EPROM), flash memory, an optical fiber, a portable CD-ROM, an optical storage device, a magnetic storage device, and/or any suitable combination of the foregoing. More generally, a computer readable storage medium may be any tangible medium that can contain, or store a program for use by, or in connection with, an instruction execution system, apparatus, or device.

Additionally, a computer readable signal medium may include a propagated data signal with computer readable program code embodied therein, for example, in baseband or as part of a carrier wave. Such a propagated signal may take any of a variety of forms such as, for example, electro-magnetic, optical, or a suitable combination thereof. More generally, a computer readable signal medium may be any computer readable medium that is not a computer readable storage medium and that can communicate, propagate, or transport a program for use by or in connection with an instruction execution system, apparatus, or device.

Program code embodied on a computer readable medium can be transmitted using an appropriate medium such as, for example, wireless, wireline, optical fiber cable, radio frequency (RF), and/or a suitable combination of the foregoing. Computer program code for carrying out operations in accordance with one or more embodiments of the invention can be written in any combination of at least one programming language, including an object oriented programming language, and conventional procedural programming languages. The program code may execute entirely on a user's computer, partly on a user's computer, as a stand-alone software package, partly on a user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In light of the above descriptions, it should be understood that the components illustrated herein can be implemented in various forms of hardware, software, or combinations thereof, for example, application specific integrated circuit(s) (ASICS), functional circuitry, an appropriately programmed general purpose digital computer with associated memory, etc.

Terminology used herein is for the purpose of describing particular embodiments only and is not intended to be limiting of the invention. For example, the singular forms "a," "an" and "the" are intended to include the plural forms as well, unless clearly indicated otherwise. It will be further understood that the terms "comprises" and/or "comprising," as used herein, specify the presence of stated features, integers, steps, operations, elements, and/or components, but do not preclude the presence or addition of another feature, integer, step, operation, element, component, and/or group thereof. Additionally, the corresponding structures, materials, acts, and equivalents of all means or step plus function elements in the claims are intended to include any structure, material, or act for performing the function in combination with other claimed elements as specifically claimed.

Also, it should again be emphasized that the above-described embodiments of the invention are presented for purposes of illustration only. Many variations and other alternative embodiments may be used. For example, the techniques are applicable to a wide variety of other types of communication systems, storage systems and processing devices that can benefit from improved rational compression of data. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method for compressing one or more numbers, said method comprising:
    obtaining a plurality of numbers, wherein each of said plurality of numbers is represented using zero or more bits to indicate an exponent at a given base of said given number and has a length representing a number of significant bits of said given number;
    for each of said plurality of numbers, obtaining a pair of values comprised of said length and said exponent and counting occurrences of said pair of values;
    generating a Huffman encoding comprising at least one Huffman tree based on said counting of said occurrences of said pair of values;
    generating one or more encoding maps comprising an array mapping each of said pair of values to a corresponding Huffman prefix code; and
    encoding at least one of said plurality of numbers using the one or more encoding maps.

2. The method of claim 1, wherein said plurality of numbers comprise one or more of integer numbers and floating point numbers, and wherein said exponent comprises zero bits for said integer numbers and wherein said floating point numbers have a significand of said length.

3. The method of claim 1, wherein said counting of said occurrences of said pair comprises incrementing a histogram bin associated with said pair.

4. The method of claim 1, wherein said Huffman encoding comprises one Huffman tree for a histogram of said pair where each leaf has a subjacent Huffman tree for a histogram of said length.

5. The method of claim 1, wherein said step of generating one or more encoding maps further comprises traversing paths within a plurality of said Huffman trees, where each path is one prefix code and leads to one leaf node storing one or more of said pair and said length.

6. The method of claim 5, wherein said plurality of numbers comprise floating point numbers and wherein said encoding maps comprise a code sequence for all possible pair values appearing in said plurality of floating point numbers.

7. The method of claim 1, wherein said plurality of numbers comprise floating point numbers and wherein said step of encoding said at least one of said plurality of floating point numbers further comprises computing said pair for each of said at least one of said plurality of floating point numbers and retrieving the corresponding Huffman prefix code for said pair and the corresponding Huffman prefix code for said length from said one or more encoding maps.

8. The method of claim 1, further comprising the step of applying a lossless compression technique to the significand.

9. The method of claim 1, wherein said method is implemented using one or more of a multi-core computer and a multi-node server.

10. The method of claim 9, wherein a plurality of instances of said method operate in parallel to compress a corresponding portion of a divided input independently.

11. The method of claim 1, further comprising the step of generating the Huffman encoding from a compressed input file.

12. The method of claim 11, further comprising the step of decoding at least one compressed sequence of bits into a floating point number using the Huffman encoding.

13. The method of claim 12, wherein the step of decoding at least one compressed sequence of bits further comprises traversing a main Huffman tree in said Huffman encoding until a first leaf node is reached, wherein the first leaf node comprises one of said pair values corresponding to a current floating point number; traversing a corresponding subjacent Huffman tree until a second leaf node is reached, wherein the second leaf node comprises one of said length values of the current floating point number; and reading a next number of bits correspopnding to said length to construct the significand of the current floating point number.

14. A computer program product comprising a tangible machine-readable storage medium having encoded therein executable code of one or more software programs for compressing one or more numbers, wherein the one or more software programs when executed perform the following steps:
   obtaining a plurality of numbers, wherein each of said plurality of numbers is represented using zero or more bits to indicate an exponent at a given base of said given number and has a length representing a number of significant bits of said given number;
   for each of said plurality of numbers, obtaining a pair of values comprised of said length and said exponent and counting occurrences of said pair of values;
   generating a Huffman encoding comprising at least one Huffman tree based on said counting of said occurrences of said pair of values;
   generating one or more encoding maps comprising an array mapping each of said pair of values to a corresponding Huffman prefix code; and
   encoding at least one of said plurality of numbers using the one or more encoding maps.

15. A system for compressing one or more numbers, comprising:
   a memory; and
   at least one hardware device, coupled to the memory, operative to implement the following steps:
   obtaining a plurality of numbers, wherein each of said plurality of numbers is represented using zero or more bits to indicate an exponent at a given base of said given number and has a length representing a number of significant bits of said given number;
   for each of said plurality of numbers, obtaining a pair of values comprised of said length and said exponent and counting occurrences of said pair of values;
   generating a Huffman encoding comprising at least one Huffman tree based on said counting of said occurrences of said pair of values;
   generating one or more encoding maps comprising an array mapping each of said pair of values to a corresponding Huffman prefix code; and
   encoding at least one of said plurality of numbers using the one or more encoding maps.

16. The system of claim 15, wherein said plurality of numbers comprise one or more of integer numbers and floating point numbers, and wherein said exponent comprises zero bits for said integer numbers and wherein said floating point numbers have a significand of said length.

17. The system of claim 15, wherein said counting of said occurrences of said pair comprises incrementing a histogram bin associated with said pair.

18. The system of claim 15, wherein said Huffman encoding comprises one Huffman tree for a histogram of said pair where each leaf has a subjacent Huffman tree for a histogram of said length.

19. The system of claim 15, wherein said step of generating one or more encoding maps further comprises traversing paths within a plurality of said Huffman trees, where each path is one prefix code and leads to one leaf node storing one or more of said pair and said length.

20. The system of claim 15, wherein said plurality of numbers comprise floating point numbers and wherein said step of encoding said at least one of said plurality of floating point numbers further comprises computing said pair for each of said at least one of said plurality of floating point numbers and retrieving the corresponding Huffman prefix code for said pair and the corresponding Huffman prefix code for said length from said one or more encoding maps.

21. The system of claim 15, wherein said at least one hardware device is further configured to apply a lossless compression technique to the significand.

22. The system of claim 15, wherein said system comprises one or more of a multi-core computer and a multi-node server.

23. The system of claim 22, wherein a plurality of instances of said system operate in parallel to compress a corresponding portion of a divided input independently.

24. The system of claim 15, wherein said at least one hardware device is further configured to generate the Huffman encoding from a compressed input file.

25. The system of claim 24, wherein said at least one hardware device is further configured to decode at least one compressed sequence of bits into a floating point number using the Huffman encoding and wherein the step of decoding at least one compressed sequence of bits further comprises traversing a main Huffman tree in said Huffman encoding until a first leaf node is reached, wherein the first leaf node comprises one of said pair values corresponding to a current floating point number; traversing a corresponding subjacent Huffman tree until a second leaf node is reached, wherein the second leaf node comprises one of said length values of the current floating point number; and reading a next number of bits corresponding to said length to construct the significand of the current floating point number.

* * * * *